United States Patent [19]
Langer et al.

[11] Patent Number: 5,014,284
[45] Date of Patent: May 7, 1991

[54] DISCRETE SLOPE DELTA MODULATION WITH RECOVERY MEANS

[75] Inventors: Alois A. Langer; Khalil J. Maalouf, both of Pittsburgh, Pa.

[73] Assignee: Cardiac Telecom Corporation, Pittsburgh, Pa.

[21] Appl. No.: 373,913

[22] Filed: Jun. 30, 1989

[51] Int. Cl.⁵ .................................. H04B 14/06
[52] U.S. Cl. .............................. 375/30; 341/65; 341/77; 375/25; 128/696; 128/704; 128/708
[58] Field of Search ............... 358/13; 382/56; 375/27, 375/30, 28, 25, 26; 341/65, 55, 77, 143; 128/696, 903, 904, 704, 703, 708; 324/77 A

[56] References Cited

U.S. PATENT DOCUMENTS

| | | | |
|---|---|---|---|
| 3,868,567 | 2/1975 | Ekstrom | 128/696 |
| 4,229,820 | 10/1980 | Enomoto | 357/27 |
| 4,369,463 | 1/1983 | Anastassiou et al. | 382/56 |
| 4,466,440 | 8/1984 | Money et al. | 128/419 |
| 4,509,529 | 4/1985 | Money et al. | 128/708 |
| 4,567,883 | 2/1986 | Langer et al. | 128/696 |
| 4,745,473 | 5/1988 | Hall | 358/13 |
| 4,809,350 | 2/1989 | Shimoni et al. | 382/56 |
| 4,839,649 | 6/1989 | Imai et al. | 357/28 |

Primary Examiner—Francis Jaworski
Assistant Examiner—George Manuel
Attorney, Agent, or Firm—Arnold B. Silverman; Suzanne Kikel

[57] ABSTRACT

A method and apparatus for processing electrical signals by modifying delta modulation to discrete slope delta modulation includes converting its electrical signals into compressed digital information, and representing this digital information as a sequence of slops or deltas added to the past value of the representation. For each sample period, a slope is chosen from slope tables having multiple entries and each choice is represented by a Huffman code. Signal compression occurs in two steps: first the selection of a small number of possible slopes provides compression and also the most probable slopes are represented by the shortest Huffman codes providing additional compression. Depending on the history of the slope chosen, multiple tables can be accessed with different slop entries. Two check point values are provided which code absolute output levels instead of slopes in order to facilitate recovery of the signal in the event of transmission errors. Initial matching of a specific slope value sought in the same table wherein the next preceding value was found. In one embodiment, at least four slope tables each having at least four values is employed. The apparatus has components for performing the method.

31 Claims, 3 Drawing Sheets

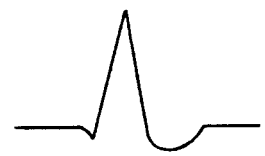
FIG. 1A  FIG. 1B
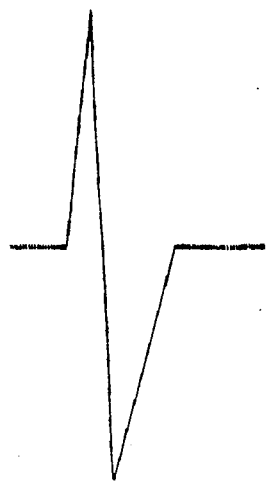
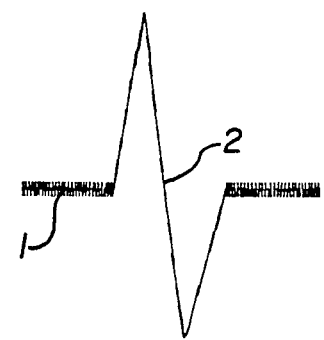
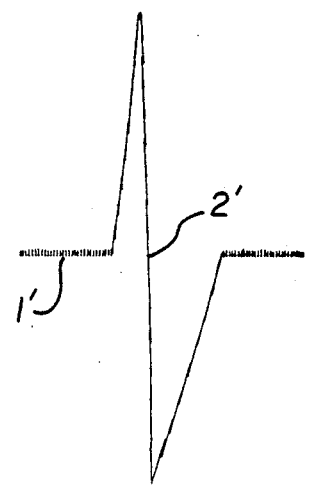
FIG. 1C  FIG. 1D  FIG. 1E
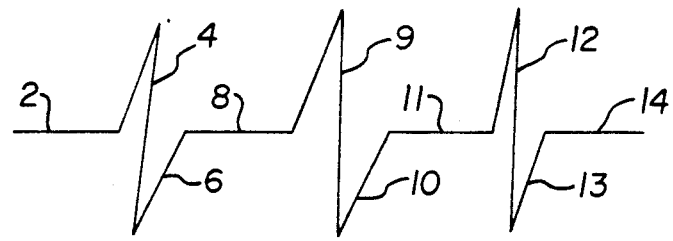
FIG. 2
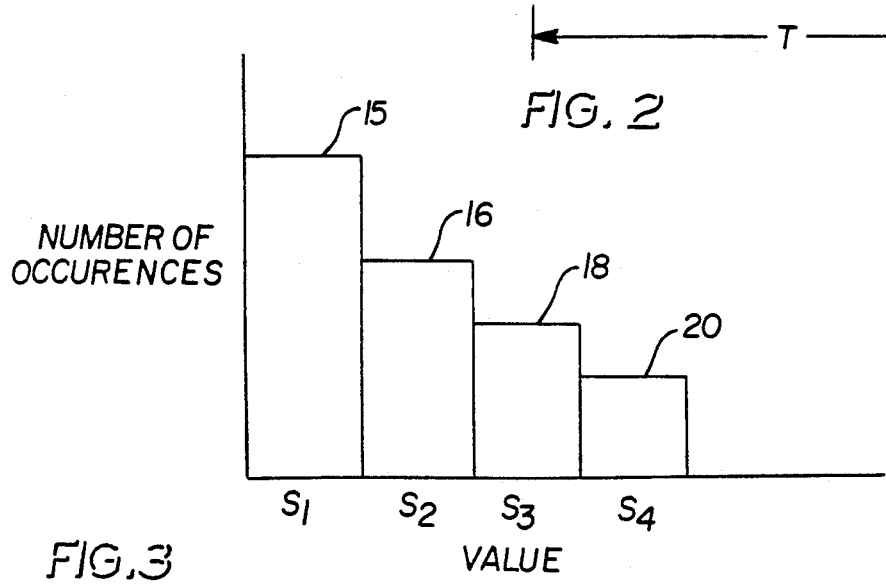
FIG. 3

DISCRETE SLOPE DELTA MODULATION WITH RECOVERY MEANS

BACKGROUND OF THE INVENTION

1. Field of the Invention

The present invention relates to a method and apparatus for employing delta modulation to compress ECG signals and convert them into binary pulse trains suitable for accurate recovery of the original data and, more specifically, it relates to such a system which provides error checking means for assisting with the recovery of data and also provides improved fidelity for encoded-decoded signals at low average bit rates and further provides information which can be used to detect certain heart arrhythmias (abnormal heart rhythms).

2. Description of the Prior Art

It has long been known to employ signal modulation techniques in the processing and communication of information. It has also been known to employ delta modulation to convert a continuous signal into a binary pulse pattern. See, generally, U.S. Pat. Nos. 3,868,567; 4,509,529 and 4,567,883.

It has been known to employ delta modulation in connection with medical information such as that contained within electrocardiograms. See, generally, U.S. Pat. Nos. 3,868,567; 4,509,529 and 4,567,883.

One of the problems with known delta modulation systems is that the compression ratio is not very high if the high slew rate portions of the signal in the R waves are to be preserved. Another problem is that it is very difficult to recover from lost data and errors in the bit stream such as losses which may occur during transmission. This can lead to informational gaps and DC level shifts and drifts which are highly undesirable.

In its simplest form a delta modulator generates a continuous sequence of bit samples. Each bit represents two states, that steps the output waveform up by one step size or down by one step size. If the input waveform starts to change in one direction, the delta modulator's output bit stream will contain a larger number of bit samples which represent movement of the output waveform in the same direction. In that manner the output waveform tracks the input waveform as long as the input waveform does not change too rapidly. See, for example, U.S. Pat. No. 4,466,440 for a discussion of a simple delta modulator.

Unfortunately, one of the limitations of delta modulators relates to its ability to track rapidly changing signals such as those in the electrocardiogram (ECG) R wave. It is well known that the ECG consists of relatively long periods or nearly flat potentials, i.e. the baseline, with periodic rapid excursions from the baseline with very high slew rate, the R wave. Conventional delta modulators are unsuitable for tracking such a waveform if the objective is to provide a bit stream from which the original signal can be reconstructed such as for data transmission. The reasons for this can be readily appreciated as the delta modulator has two opposing constraints. In order to track small changes in the baseline period, the step size must be kept small, but a small step will not track the rapid changes in the R wave unless the sample rate is extremely high. At low clock rates the delta modulator is said to be "slew rate limited".

U.S. Pat. No. 4,509,529 discusses event detection by production of a sequence of consecutive ones from a data modulator. It states that a basic problem with such a slew rate limited delta modulator is that the bit sample sequence generated by the device is not a true digital representation of the analog input and it does not allow a true replica of the input signal to be reconstructed from the bit samples. In this patent it is suggested to increase the clock rate to 8 KHz in order to allow more accurate tracking of the input signal. However, for data transmission, a bit rate of 8000 bits/sec. is far too high to be practical.

It has been suggested to solve the slew limited response problem by changing the step size in response to the history of the signal. This is commonly known as continually variable slope delta modulation or CVSD. CVSD techniques are described in Motorola application note for the MC3417-MC3418 integrated circuits and U.S. Pat. No. 4,567,883. The basic idea is to change the slope or amount of change that the reconstructed signal can take during one bit period in response to the past history of the bit stream. For example, if 3 ones occur in a row, a signal is passed to an integrator whose output increases the step size.

CVSD techniques, however, have disadvantages. One concern is that of overshoot. After tracking a rapidly changing waveform such as an R wave, the step size or slope has been increased to keep up with the high slew segments. When these high slews stop suddenly at the end of the R wave, the delta modulator is "stuck" in high step mode for a short period of time, and must continue producing samples at high slew rates until the slope determining integrator can ramp back down again. This process can take many clock cycles and leads to overshoot or ringing after an R wave as shown in FIG. 1. FIG. 1(a) shows an original wavefrom with ST depression and FIG. 1(b) shows the reconstructed waveform with distorted ST segment. This overshoot can distort the critical ST segment in the reconstructed ECG waveform. Conventional delta modulators exhibit additional shortcomings. As the delta modulator reconstructs the signal as a series of changes or deltas added to some initial value, a typical delta modulator cannot accurately transmit a DC level. In case of error when some of the data lists are lost due to losses in a transmission medium, the operational DC level is lost and the signal may shift to an undesirable DC level which cannot be processed by subsequent circuitry due to this error induced offset voltage. Conventional delta modulators suffer from both shortcomings; i.e., the inability to track R waves if the sampling clock rate is low, and persistent level shifts in case of lost data or inaccurate reconstruction.

There remains, therefore, a need for providing improved means of efficiently using delta modulation concepts in medical as well as other environments.

SUMMARY OF THE INVENTION

The present invention has met the above-described needs. In the preferred method of the present invention, continuous electrical signals are converted to compressed digital information i.e., binary pulse trains using improved delta modulation techniques. By employing a plurality of slope tables each having a plurality of slope values, more characteristics of the signal are retained at a higher compression ratio. Each sample frame now consists of multiple bits which select one of the slopes from the appropriate slope table. In this way a new slope can be made available very quickly with only one sample frame delay time. Furthermore, a frequency of occurrence table, of at least some of the slope values of the signal is readily generated which can be used for further processing and arrhythmia detection. The choice of the slope table used at each step depends on the rate of change of the signal. The choice of the slope value depends on the difference between the value of the signal and the value of a digital counter which is updated to track the signal.

For added error recovery features, two preset check point levels are used to set the counter to a known state whenever the continuous signal crosses them, thereby restoring a correct DC level at these check points. The slope values and the check points are coded using the Huffman code because it provides some additional compression and does not need synchronization. The signal may then be recovered by decoding the Huffman code. The technique is readily adaptable to microprocessor implementation as will be apparent to those skilled in the art.

It is an object of the present invention to provide a method and apparatus for efficiently employing delta modulation techniques in the processing of electrical signals.

It is a further object of the present invention to provide such a system which is usable in connection with electrocardiogram signals to provide high fidelity reconstructed signals.

It is a further object of the present invention to provide such a system which has means for rapid recovery in the event of lost data.

It is another object of the present invention to provide such a system which employs a frequency of occurrence table of slope values of the electrical signals in processing the reconstructed signals.

It is a further object of this invention to provide such a system which will operate efficiently, rapidly and reliably without requiring synchronization with the receiver system and is readily implemented by means of microprocessors.

These and other objects of the present invention will be more fully understood from the following description of the invention on reference to illustrations appended hereto.

BRIEF DESCRIPTION OF THE DRAWINGS

FIGS. 1A, 1B and are waveforms, respectively, representing an original waveform with ST depression and a reconstructed waveform with a distorted ST segment.

FIGS. 1C through 1E are computer simulations showing an original waveform (FIG. 1C), a slew rate limited output of a conventional delta modulator (FIG. 1D), and the output of the modulator of the present invention (FIG. 1E).

FIG. 2 is a schematic illustration of a waveform to be processed in accordance with the present invention.

FIG. 3 is a plot of the frequency of occurrences of specific slope values.

DESCRIPTION OF THE PREFERRED EMBODIMENTS

Figure 4:
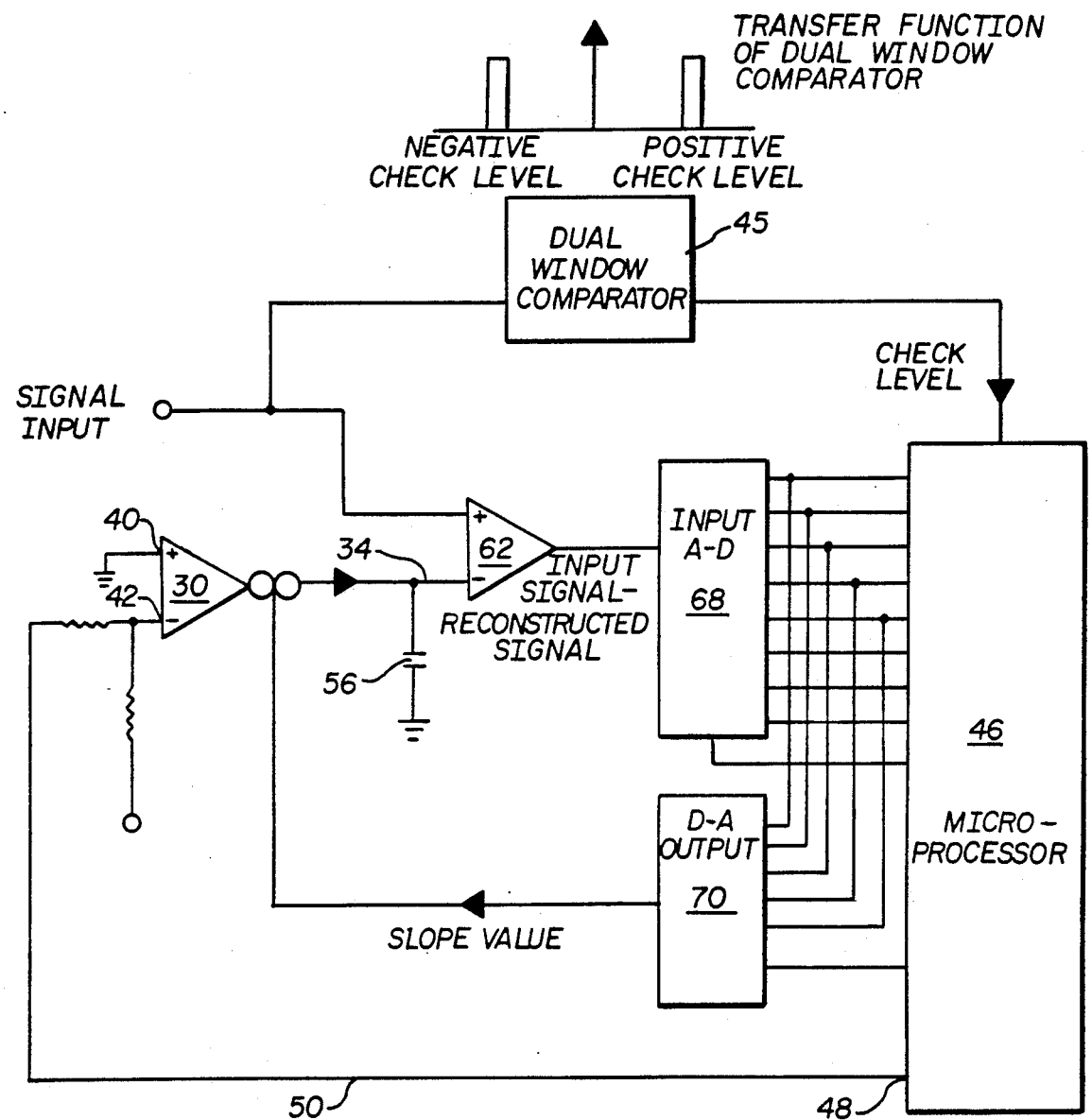
FIGS. 4 and 5 are schematic illustrations of apparatus employable in the invention.

FIGS. 1 A and 1B show waveforms representing the original waveform with the ST depression and a reconstructive waveform with a distorted ST segment.

Referring more specifically to FIGS. 1C, 1D and 1E, there are shown three waveforms which are plots of a computer simulation of a simple delta modulator. The input waveform is shown in FIG. 1C, the simple modulator's output is shown in FIG. 1D and the output of the present invention is shown in FIG. 1E. The steps in the baseline 1 in FIG. 1B are caused by large alternate positive and negative and the inability to follow the high slew is shown at 2. By contrast, FIG. 1E illustrates how the modulator of the present invention tracks the input in a generally identical manner, as indicated b reference numbers 1' and 2'.

FIG. 2 illustrates a waveform representation over a time period T. The waveform may be considered as having a zero value at plateau region 2, a positive value at wave portion 4 an a negative value at wave portion 6. Similarly, levels 8, 11 and 14 have zero values, levels 9 and 12 have positive values and levels 10 and 13 have negative values.

While the invention may be employed to process a wide variety of waveforms for simplicity of disclosure herein, emphasis will be placed upon processing of human electrocardiogram signals such as is shown in FIG. 2.

In a preferred practice of the present invention, at least four slope tables, each containing at least four slope values, will be employed in updating a digital counter to approximate the electrical signal at each instant in time. Each slope value's occurrence is then coded into a bit stream by its Huffman code. This first step results in a bit stream of Huffman codes representing slopes which compress the data into a very small number of bits and allow for later reconstruction of the original signal.

With respect to cardiac arrhythmic detection uses, the present invention contemplates monitoring heart rhythm by monitoring averages over time as distinguished from emphasis on identification and classification of individual beats.

In a manner to be described hereinafter, a microprocessor is adapted to have suitable software to receive the slope information from the data modulator and to construct a table of the number of occurrences of each slope value over the last averaging period which may be about 10 to 15 seconds, for example. The number of occurrences is tabulated by multiple counting registers in the microprocessor. This information is stored in the microprocessor as an array which can be visualized by information of the type shown graphically in FIG. 3. For example, the slope value $S_1$ as shown in FIG. 3 had the most occurrences 15 in the time period T with the next most frequent occurrence 16 being slope value $S_2$ and progressively diminishing values 18, 20 respectively, for slope values $S_3$, $S_4$.

The operation of the compression section is best understood by referring to the preferred embodiment as shown in FIG. 4. Transconductance amplifier 30 produces an output current on lead 34 which is the product of its set current ($I_{set}$) and the voltage difference between its input pins 40, 42. The sign bit 48 on the microprocessor 46 is connected to amplifier 4 by lead 50 and is used to control this voltage difference and in one case cause it to be positive and in the other case negative.

Output current $I_1$ is placed across integrating capacitor 56 which then produces a ramp in response to the current. The slope can be varied by changing $I_{set}$ and the direction of integration can be changed by changing the sign bit. The voltage across capacitor 56 is the local reconstructed signal and is compared to the input signal by difference amplifier 62. This amplifier 62 produces a voltage which is proportional to the error or difference between the local reconstructed signal and the signal input. A-D converter 68 makes this difference available to the microprocessor 46 for determination of the next appropriate slope value which will minimize the difference between the reconstructed signal and the input signal. The modulator is a sampled data system and all timing is provided by the microprocessor 46.

The dual window comparator 45 determines when the input level is at or near one of the two check points by determining if the level is within a predetermined window and delivers this information to the microprocessor 46.

It should be noted that everywhere in this embodiment the signal processing paths with limited dynamic range, namely the A-D and D-A convertors 68, 70, deal with signal differences rather than absolute signal levels. As the desired goal is that the reconstructed signal and its input signal track each other, this difference is rarely large and the same is true for the slope values producing the reconstructed signal. With this limited dynamic range, inexpensive converters such as 6 bit devices can be used, but the dynamic range of the reconstructed signal can exceed the dynamic range of the converters 68, 70. The ultimate dynamic range is related to the ratio of the smallest step which can be taken and the voltage which can be handled by the difference amplifier 62 and could easily exceed 10 bit precision.

Figure 5:
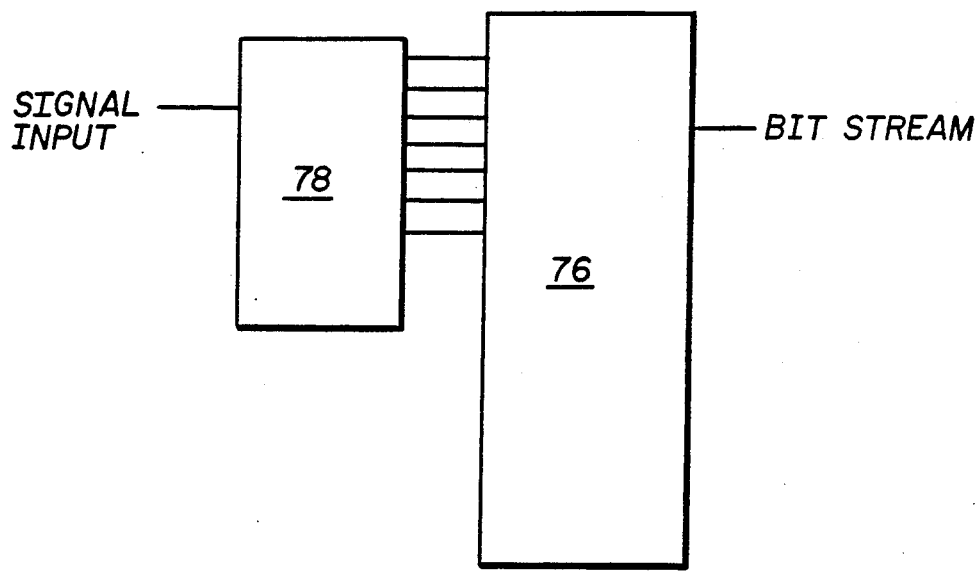

In the alternate embodiment of FIG. 5, the absolute level of the input signal is read by the microprocessor 76 and is limited to the precision of the converter 78, in this case 8 bits. The reconstructed signal in this case is computed internally in the microprocessor 76 by means of a counter register. The counter register is analogous to capacitor 56.

The microprocessor 46 contains software which provides the appropriate slope for this sample period via the D-A converter. In the case of the simpler system the data is read from the table and added to the value in the counter register holding the reconstructed signal. Slopes are selected from slope tables which are pre-programmed into the microprocessor. Two check point levels are provided and when the signal is at the check level, code produced identifies the occurrence of this level as an absolute voltage rather than a slope.

By way of example, for comparison to an ECG waveform sampled at the rate of 250 samples per second with a 8-bit resolution, a data modulator system may have four slope tables in accordance with the following breakdown: The first table may be deemed the "high negative table" and have values of [−30, −12, −2, 5]. The second table, the "low negative table" may have values [−5, −2, 2, 5]. These two tables are used primarily when the input waveform is changing in the negative direction. The third table, the "low positive table", may have values identical to the low negative table but changed in sign, and the fourth table, the "high positive table" may have values [−5, 2, 12, 30]. The two check point levels may be set at 80 and −80, so that on the the average they would occur twice during each heart beat. Normally, ECG's spend more time at the baseline and low slopes are more likely. Therefore, the most probable slopes are coded with the shortest Huffman codes to achieve additional compression. In accordance with their probability of occurrence the first entry of each slope table is coded by 110, the second by 10, the third by 0, and the fourth by 1110. The two check points are coded by 11110 and 11111 as the largest Huffman codes since the absolute levels of the check points occur least frequently. The algorithm is initialized by setting the digital counter to zero, and choosing the second slope table. At each sampling point thereafter, the value of the electrical signal is compared to the counter or the difference is directly read by th A-D converter. The most appropriate slope value from the recently chosen slope table is added to the counter or output to the D-A 70.

If any of the two check point levels is closer to the value of the signal than the counters, the corresponding check point's code is added to the Huffman code, otherwise the selected slope's code is added to the Huffman code. If the jth slope value is used, then the jth slope table is chosen for the next sampling point. In this way if more high slopes occur in a row, a new table containing higher slopes can be entered. In this manner, only four slopes selected from multiple tables need to be coded. This results in more efficiently compressed data. On the average, a compression ratio of 4 to 1 is achieved using these values.

If an error occurs during the transmission of the digital code, it will be quickly corrected immediately after the occurrence of a zero in the Huffman code, thereby reestablishing synchronization, and the correct absolute DC level of the signal will then be regained at the first crossing of a checking point. To accomplish this the receiver automatically sets its output to the check point level upon receipt of a check point code. A greatly exaggerated sketch of input signal 79 and the reconstructed signal 80 with appropriate slope changes is shown in FIG. 6.

Figure 6:
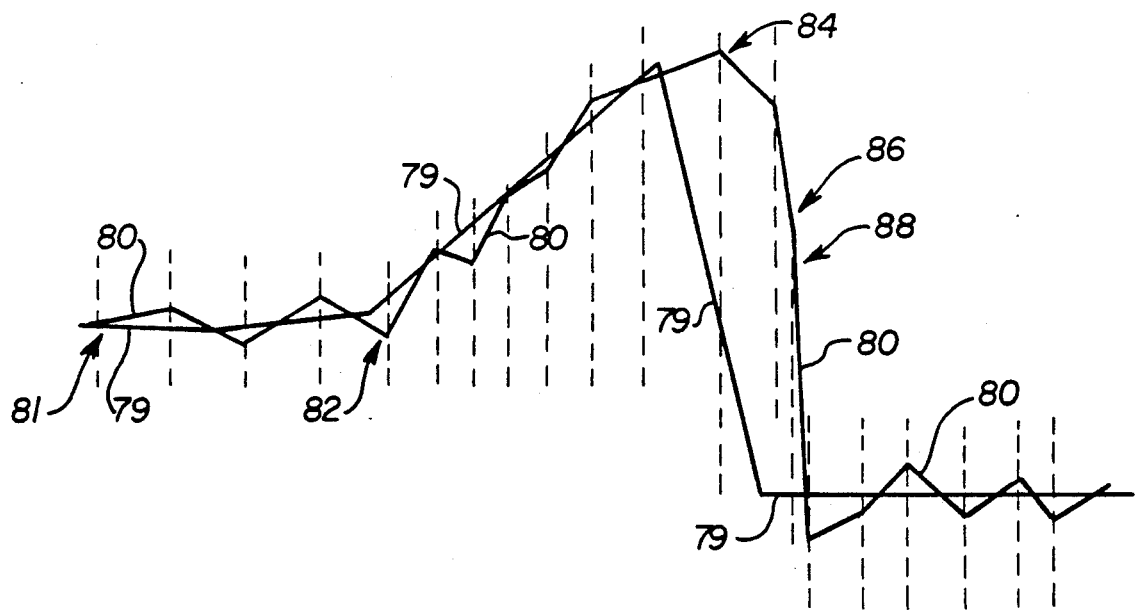
FIG. 6 is a modified representation of an input signal and a reconstructed signal.

As shown in FIG. 6, portion 81 illustrates a constant level being tracked by small steps and portion 82 illustrates the difference between the input signal and the reconstructed signal increasing thereby causing a higher slope to be chosen from the slope table. A sign change occurs at portion 84. At the portion labelled 86 a table change occurs as the highest slope was chosen from the low slope table. In region 88 the highest negative slope is chosen from the table.

The compression technique of this invention provides information which can be used to detect certain cardiac arrhythmias. As each particular slope occurs, a counter register specific to that slope is incremented by one. This process continues over a preset averaging period until at the end of this period each counter register contains the number of occurrences of each slope in the period. These numbers are then cross correlated with preset templates resulting in a set of correlation factors which represent the similarity of the counts in the registers to the templates. The templates providing the best fit identifies the arrhythmia.

This method is particularly effective in detecting ventricular fibrillation, ventricular tachycardia and aiding in the discrimination of ventricular tachycardia and supraventricular tachycardia.

While the algorithm employed to practice the present invention may be developed readily by one skilled in the art, the following represents a preferred algorithm.

The Algorithm

1. Initialize: slope tables (number and values depend on the application), check points, counter, and the original table in which the search of the best slope occurs.

| | | |
|---|---|---|
| Init: | slope table | slope [i,j], 0 i,j ≦ 4; |
| | check points | valp = . . . ; valm = . . . ; |
| | counter | count = . . . ; |
| | history | hist = 1; |

2. At each step: obtain the current value of the continuous signal z(k); from the previously chosen slope table slope [hist,], select the best slope j* which when added to the counter, count, would best approximate the value of the continuous signal.

process:

read z(k), the current value of the signal; choose ]* from slope [hist, j]such that abs(count+slope[-hist,]*]−z(k)) is minimized.

3. If after updating the counter, the value of the continuous signal remains closer to any of the two check points valp or valm than to the counter, then the corresponding check point is coded, and the counter value is set to the value of the check point. To determine which slope table should be used for the next iteration, select the slope which when added to the previous counter value best approximates the value of the check point. The index of this slope determines the next slope table.

Check/pt:

if abs(count+slope[hist,j*]−z(k))

if abs(z(k)−valp)<abs(count+slope[hist,j*] −z(k)) then choose j* in slope[hist,*j]such that abs(count+slope[-hist,j*]−valp) is minimized count =valp; hist =j*; go to process.

if abs(z(k)−valm)<abs(count+slope[hist,]*]−z(k)) then choose j* in slope[hist,j*]such that abs(count+slope[-hist,j*]−valm) is minimized count =valve; hist=j*; go to process.

4. If after updating the counter, the value of the continuous signal is closer to the counter than any of the two check points, then the chosen slope is coded, and its index determines the slope table that should be used for the next iteration.

count=count+slope[hist,j*]; hist=j*; go to process.

It will be appreciated that the additional use of the Huffman code to encode the slopes not only enhances signal compression but also eliminates the need to effect synchronization between the transmitter which transmits the compressed digital information and the receiver which reconstructs the initial signals.

It will be appreciated, therefore, that the present invention has provided an effective method and apparatus for employing delta modulation procedures to compress information an convert the same into binary pulses while providing means for quickly recovering the correct DC level of the signal in the event that an error in transmission has occurred. All of this is accomplished in a simple, reliable and efficient manner.

It will be appreciated that while reference has been made herein to human cardiac monitoring through an electrocardiogram, the compression methods and apparatus of the present invention are not so limited and may be employed with a wide variety of waveform systems emanating from many sources in many environments. It could be employed, for example, with the monitoring and processing of respiration, electroencephalograms and speech, as well as other uses.

Whereas particular embodiments of the invention have been described herein for purposes of illustration, it will be appreciated by those skilled in the art that numerous variations of the details can be made without departing from the invention as described in the appended claims.

What is claimed is:

1. A method of processing an electrical signal by delta modulation comprising converting said electrical signal into compressed digital information by delta modulation, employing a plurality of slope tables each having a plurality of slope values in establishing said compressed digital information, and effecting said compression by employing a code having a different value for each said slope value.

2. The processing method of claim 1 including effecting said compression in part due to the use of a limited number of slope values.

3. The processing method of claim 2 including employing the Huffman code as said code.

4. The processing method of claim 3 including assigning a Huffman code value to each said slope value in such manner that the slope values likely to actually occur most frequently will have shorter Huffman code numbers than those likely to occur less frequently.

5. The processing method of claim 4 including employing at least two check point values to facilitate recovery of said compressed digital information in the event of transmission errors.

6. The processing method of claim 5 including employing at least four said slope tables with one table having higher positive value than the others and one having higher negative values than the other.

7. The processing method of claim 6 including employing at least four slope values in each said slope table.

8. The processing method of claim 5 including employing the rate of signal change to select a slope table.

9. The processing method of claim 8 including selecting a slope value within said selected slope table by comparing the value of the signal with the value of a counter containing said digital information.

10. The processing method of claim 9 including in the event that after adding a slope value to the counter, the value of the next succeeding slope is closer to the check point value than to another slope table value, setting the counter value to the check value and recalculating the history employing the check point value as the current slope value.

11. The processing method of claim 9 including employing as said slope tables tables having both positive and negative values.

12. The processing method of claim 2 including effecting a match between a value of said electrical signal at a specific time and a said slope table value, and initiating efforts to effect a said match with the next said electrical signal within the same said slope table.

13. The processing method of claim 12 including assigning a Huffman code binary number for each said slope table.

14. The processing method of claim 1 including employing said method in processing electrocardiogram signals.

15. The processing method of claim 14 including providing each said slope table with at least four discrete slope values.

16. The processing method of claim 15 including effecting said compression to at least about one-quarter the original size.

17. The processing method of claim 16 including transmitting said compressed binary pulse to a receiver.

18. The processing method of claim 14 including monitoring the frequency of occurrence of said slope values.

19. The processing method of claim 18 including comparing said frequency of occurrence information with a template to determine the nature of a heart arrhythmia.

20. Apparatus for processing an electrical signals by delta modulation comprising conversion means for converting said electrical signal into compressed digital information by delta modulation, said conversion means having slope determining means for correselecting a slope table and a slope value within said table ponding to said electrical signal, and code means for converting said slope value corresponding to said electrical signal into said compressed digital information.

21. The processing apparatus of claim 20 including said code means employing a Huffman code.

22. The processing apparatus of claim 21 including said code means assigning a code value to each said slope value.

23. The processing apparatus of claim 22 including said code means assigning said code value in such manner that the slope values likely to occur with great frequency will have a lower code value than those which will be likely to occur with less frequency.

24. The processing apparatus of claim 23 including said conversion means having digital counter means and means for selecting a said slope table for a said electrical signal based upon the value of said signal and the count on said counter means.

25. The processing apparatus of claim 20 including said slope determining means having a plurality of slope tables, each slope table having a plurality of discrete slope values, and said compression means having two check point values for facilitating recovery of the signal in the event of transmission errors.

26. The processing apparatus of claim 25 including tables.

said slope determining means having at least four slope

27. The processing apparatus of claim 26 including said slope tables having slope values suitable for use with electrical signals obtained from human electrocardiograms.

28. The processing apparatus of claim 27 including said slope tables each having at least four slope vaiues.

29. The processing apparatus of claim 28 including said compression means having means for effecting compression of said pulses to at least one-quarter their original size.

30. The processing apparatus of claim 27 including means for generating frequency of occurrence information with respect to said slope values.

31. The processing apparatus of claim 30 including template means for comparing said frequency of occurrence information with a predetermined set of template values in evaluating said electrocardiogram.

* * * * *

UNITED STATES PATENT AND TRADEMARK OFFICE
CERTIFICATE OF CORRECTION

PATENT NO. : 5,014,284

DATED : May 7, 1991

INVENTOR(S) : ALOIS A. LANGER and KHALIL J. MAALOUF

It is certified that error appears in the above-identified patent and that said Letters Patent is hereby corrected as shown below:

In the Abstract, line 5, "slops" should be --slopes--.

In the Abstract, line 15, "slop" should be --slope--.

Column 1, line 53, "or" should be --of--.

Column 3, line 47, "FIGS. 1A, 1B and" should read --FIGS. 1A and 1B--.

Column 4, line 8, --steps-- should be inserted after "negative".

Column 4, line 11, "b" should be --by--.

Column 4, line 16, "an" should be --and--.

Column 4, line 61, "amplifier 4" should be --amplifier 40--.

Column 6, line 8, "th" should be --the--.

UNITED STATES PATENT AND TRADEMARK OFFICE
CERTIFICATE OF CORRECTION

PATENT NO. : 5,014,284

DATED : May 7, 1991

INVENTOR(S) : ALOIS A. LANGER and KHALIL J. MAALOUF

It is certified that error appears in the above-identified patent and that said Letters Patent is hereby corrected as shown below:

Column 7, line 9, "[hist,]" should be --[hist,j]--.

Column 7, line 13, "]*" should be --j*--.

Column 7, line 15, "]*" should be --j*--.

Column 7, line 26 should be deleted in its entirety.

Column 7, line 35, "value" should be --valm--.

UNITED STATES PATENT AND TRADEMARK OFFICE
CERTIFICATE OF CORRECTION

PATENT NO. : 5,014,284

DATED : May 7, 1991

INVENTOR(S) : Alois A. Langer, et al

It is certified that error appears in the above-identified patent and that said Letters Patent is hereby corrected as shown below:

Claim 20, column 9, line 18, "signals" should be --signal--.

Claim 20, column 9, line 24, "correselecting" should be --selecting--.

Claim 20, column 9, line 25, "ponding" should be --corresponding--.

Claim 26, column 10, line 17, "tables" should be deleted.

Claim 26, column 10, line 19, --tables-- should be inserted after "slope".

Signed and Sealed this

Ninth Day of March, 1993

*Attest:*

STEPHEN G. KUNIN

*Attesting Officer*     *Acting Commissioner of Patents and Trademarks*